United States Patent
Kobayashi

(10) Patent No.: US 9,963,036 B2
(45) Date of Patent: May 8, 2018

(54) VEHICLE GROUND FAULT DETECTION APPARATUS

(71) Applicant: CALSONIC KANSEI CORPORATION, Saitama-shi, Saitama (JP)

(72) Inventor: Yasuhiro Kobayashi, Saitama (JP)

(73) Assignee: CALSONIC KANSEI CORPORATION, Saitama-shi, Saitama (JP)

( * ) Notice: Subject to any disclaimer, the term of this patent is extended or adjusted under 35 U.S.C. 154(b) by 0 days. days.

(21) Appl. No.: 15/313,996

(22) PCT Filed: Apr. 3, 2015

(86) PCT No.: PCT/JP2015/001908
§ 371 (c)(1),
(2) Date: Nov. 25, 2016

(87) PCT Pub. No.: WO2015/182030
PCT Pub. Date: Dec. 3, 2015

(65) Prior Publication Data
US 2017/0197508 A1 Jul. 13, 2017

(30) Foreign Application Priority Data
May 26, 2014 (JP) .................................. 2014-108209

(51) Int. Cl.
*G01N 27/416* (2006.01)
*B60L 3/00* (2006.01)
(Continued)

(52) U.S. Cl.
CPC .......... *B60L 3/0046* (2013.01); *G01R 31/025* (2013.01); *G01R 31/362* (2013.01)

(58) Field of Classification Search
CPC .. B60L 3/0069; B60L 3/00046; G01R 31/006
(Continued)

(56) References Cited

U.S. PATENT DOCUMENTS

| | | | |
|---|---|---|---|
| 2006/0294425 A1* | 12/2006 | Kollner | G01R 31/025 714/30 |
| 2012/0043967 A1* | 2/2012 | Miura | B60L 3/0069 324/426 |

(Continued)

FOREIGN PATENT DOCUMENTS

| | | |
|---|---|---|
| JP | 2003250201 A | 9/2003 |
| JP | 2012168072 A | 9/2012 |

OTHER PUBLICATIONS

Jun. 30, 2015, International Search Report issued in the International Patent Application No. PCT/JP2015/001908.
(Continued)

*Primary Examiner* — Reena Aurora
(74) *Attorney, Agent, or Firm* — Kenja IP Law PC

(57) ABSTRACT

This vehicle ground fault detection apparatus maintains a high level of insulation in an aluminum electrolytic capacitor to improve long-term reliability. This vehicle ground fault detection apparatus (10) detects a ground fault of a DC power supply by connecting the positive terminal or the negative terminal of a high-voltage power supply to one terminal of a coupling capacitor (15) provided with aluminum electrolytic capacitors (C1, C2, C3), applying a square-wave pulse signal to a measurement point at the other terminal of the coupling capacitor, and detecting a voltage signal generated at the measurement point. The vehicle ground fault detection apparatus (10) includes a charger and discharger (CPU 13) that charges and discharges the coupling capacitor when a ground fault of the DC power supply is not being detected.

20 Claims, 6 Drawing Sheets

(51) Int. Cl.
  *G01R 31/36* (2006.01)
  *G01R 31/02* (2006.01)
(58) Field of Classification Search
  USPC .......................................................... 324/426
  See application file for complete search history.

(56) References Cited

U.S. PATENT DOCUMENTS

2013/0278272 A1  10/2013  Kaminski et al.
2013/0300430 A1  11/2013  Lindsay et al.

OTHER PUBLICATIONS

Dec. 1, 2016, International Preliminary Report on Patentability issued in the International Patent Application No. PCT/JP2015/001908.

* cited by examiner

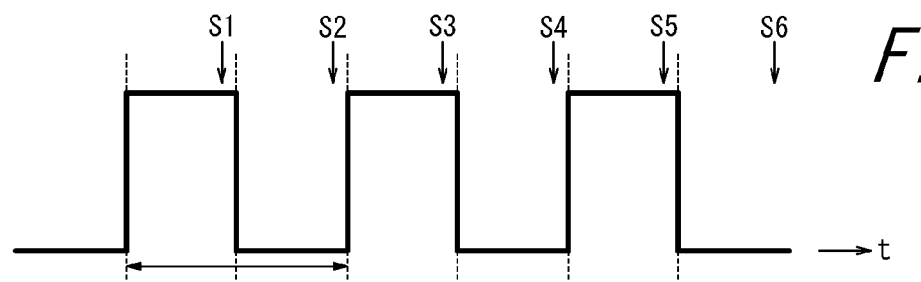
FIG. 2A
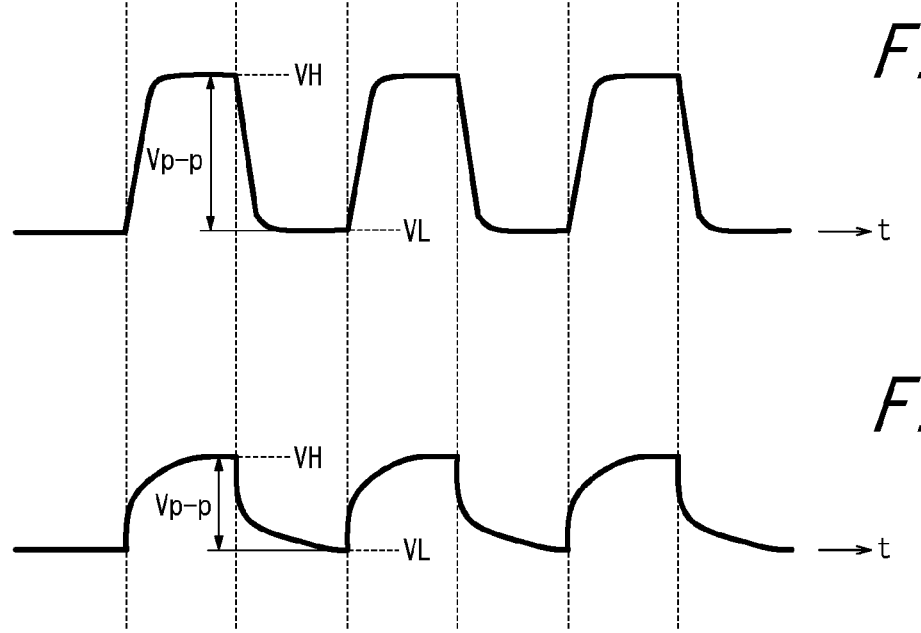
FIG. 2B
FIG. 2C

VEHICLE GROUND FAULT DETECTION APPARATUS

CROSS-REFERENCE TO RELATED APPLICATION

This application claims priority to and the benefit of Japanese Patent Application No. 2014-108209 filed May 26, 2014, the entire contents of which are incorporated herein by reference.

TECHNICAL FIELD

This disclosure relates to a vehicle ground fault detection apparatus with increased accuracy.

BACKGROUND

A high-voltage power supply may be provided in vehicles, such as electric vehicles. Conventionally, a ground fault between the high-voltage part of a vehicle (high-voltage side) and the vehicle body has been detected. In the case of a ground fault, the potential of the vehicle body (body earth) is unstable and may affect operations by the low-voltage part of the vehicle (low-voltage side).

JP 2003-250201 A (PTL 1), for example, discloses a method to detect a ground fault by applying a pulse voltage via a resistor to a capacitor having one terminal connected to the high-voltage side and monitoring the voltage waveform at the connection point between the capacitor and the resistor. The method in PTL 1 reduces the effect of impedance caused by the capacitance of the vehicle body itself and allows highly accurate detection of a ground fault.

CITATION LIST

Patent Literature

PTL 1: JP 2003-250201 A

SUMMARY

Technical Problem

The configuration disclosed in PTL 1 is applicable to any type of capacitor. There is a tendency to use a capacitor that individually has a large capacitance, however, since the capacitor is disposed at the border between the high-voltage side and the low-voltage side, and since the area where the ground fault detection apparatus can be installed in the vehicle is limited. Therefore, an aluminum electrolytic capacitor is often selected.

Aluminum electrolytic capacitors generally have the property of a possible increase in leakage current upon being left without any load for an extended period of time. When there is no ground fault between the high-voltage side and the vehicle body, the aluminum electrolytic capacitor used in the ground fault detection apparatus remains in a no-load state for an extended period of time, and leakage current may increase, reducing the insulation resistance. In this case, a vehicle that is determined to have poor insulation resistance at the time of diagnosis may experience a system fail, no longer be able to run, and require repair. In order to prevent this situation, a capacitor that has long-term reliability needs to be used, but this increases costs.

Therefore, a ground fault detection apparatus that can guarantee long-term reliability even when using an aluminum electrolytic capacitor is preferable. It would be helpful to provide a vehicle ground fault detection apparatus that maintains a high level of insulation in an aluminum electrolytic capacitor to improve long-term reliability.

Solution to Problem

A vehicle ground fault detection apparatus according to a first aspect of this disclosure is for detecting a ground fault of a DC power supply by connecting a positive terminal or a negative terminal of a high-voltage power supply to one terminal of a coupling capacitor provided with an aluminum electrolytic capacitor, applying a square-wave pulse signal to a measurement point at the other terminal of the coupling capacitor, and detecting a voltage signal generated at the measurement point, the vehicle ground fault detection apparatus including a charger and discharger configured to charge and discharge the coupling capacitor when a ground fault of the DC power supply is not being detected.

A vehicle ground fault detection apparatus according to a second aspect further includes a voltage measurement unit configured to measure a voltage of the coupling capacitor after charging.

In a vehicle ground fault detection apparatus according to a third aspect, the voltage measurement unit is further configured to measure a voltage of a battery for vehicle driving.

In a vehicle ground fault detection apparatus according to a fourth aspect, a battery for vehicle driving is used as a power supply to charge the coupling capacitor.

In a vehicle ground fault detection apparatus according to a fifth aspect, a voltage detection resistor is used in a circuit to discharge the coupling capacitor.

In a vehicle ground fault detection apparatus according to a sixth aspect, the coupling capacitor is charged and discharged while the ignition is off.

In a vehicle ground fault detection apparatus according to a seventh aspect, the coupling capacitor comprises a plurality of aluminum electrolytic capacitors.

Advantageous Effect

The vehicle ground fault detection apparatus according to the first aspect includes a charger and discharger that charges and discharges the coupling capacitor when a ground fault of the DC power supply is not being detected. Therefore, the vehicle ground fault detection apparatus according to the first aspect does not leave the aluminum electrolytic capacitors in a no-load state for an extended period of time, thus allowing a high level of insulation to be maintained in the aluminum electrolytic capacitors to improve long-term reliability.

With the vehicle ground fault detection apparatus according to the second aspect, for example an open fault or the like in the aluminum electrolytic capacitors can be detected by the voltage measurement unit measuring the voltage of the coupling capacitor. In other words, in addition to ground fault detection, the vehicle ground fault detection apparatus according to the second aspect can detect failure of the aluminum electrolytic capacitors.

In the vehicle ground fault detection apparatus according to the third aspect, an existing circuit that measures the voltage of a battery for vehicle driving is used as a voltage measurement unit, allowing an increase in circuit scale to be suppressed.

In the vehicle ground fault detection apparatus according to the fourth aspect, an existing battery for vehicle driving is used as the power supply for charging the coupling capacitor, allowing an increase in circuit scale to be suppressed.

In the vehicle ground fault detection apparatus according to the fifth aspect, an existing voltage detection resistor is used as the discharge resistor in the circuit to discharge the coupling capacitor, allowing an increase in circuit scale to be suppressed.

With the vehicle ground fault detection apparatus according to the sixth aspect, the coupling capacitor can be charged and discharged when ground fault detection is not being executed. Ground fault detection might be executed while the vehicle is running (when the vehicle's ignition is on), but charging and discharging of the aluminum electrolytic capacitor is performed while avoiding this time period. Therefore, without impeding ground fault detection, a high level of insulation in the aluminum electrolytic capacitor can be maintained.

With the vehicle ground fault detection apparatus according to the seventh aspect, even if some of the aluminum electrolytic capacitors short out, withstand voltage can be guaranteed with the remaining aluminum electrolytic capacitors. Hence, a failure resistant coupling capacitor can be implemented.

BRIEF DESCRIPTION OF THE DRAWINGS

In the accompanying drawings:

FIGS. 2A, 2B, and 2C are timing flowcharts illustrating a square-wave pulse signal and voltage signals at measurement point A;

DETAILED DESCRIPTION

Overall Structure

The following describes embodiments of this disclosure. First, the overall structure of a ground fault detection apparatus 10 according to an embodiment is described with reference to FIG. 1. The ground fault detection apparatus 10 of this embodiment is, for example, a vehicle ground fault detection apparatus mounted in a vehicle, such as an automobile. In this embodiment, the ground fault detection apparatus 10 is described as being mounted in an electric vehicle.

Figure 1:
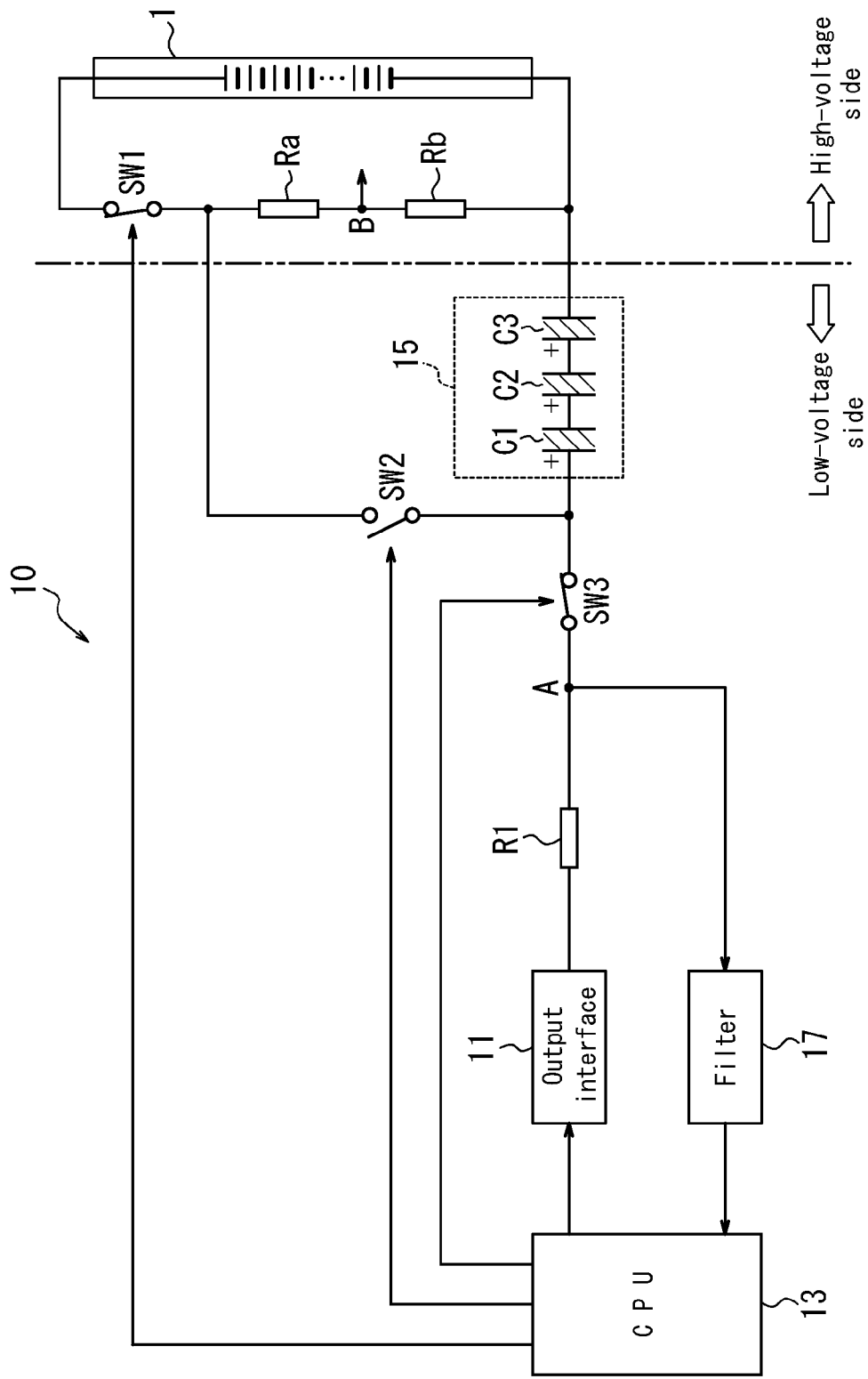
FIG. 1 illustrates a vehicle ground fault detection apparatus according to a disclosed embodiment at the time of insulation level detection.

As illustrated in FIG. 1, the ground fault detection apparatus 10 is connected to a battery 1. The battery 1 in this embodiment is a DC power supply and is used as a high-voltage power supply for vehicle driving of the electric vehicle. The battery 1 for example accumulates (charges with) electrical energy obtained by conversion with an alternator and for example provides (discharges) electrical energy to a drive motor. While the vehicle is running, the ground fault detection apparatus 10 detects the occurrence of a ground fault of the battery 1. "While the vehicle is running" refers to the time from when the vehicle's ignition is on until it is off. Hereinafter, "while the vehicle is running" is also referred to as the ignition being on, and "while the vehicle is not running" is also referred to as the ignition being off.

As illustrated in FIG. 1, a circuit formed by the battery 1, switch SW1, and resistors Ra and Rb is provided on the high-voltage side. The battery 1 is a high-voltage (for example, several hundred volts) storage battery used for vehicle driving of the electric vehicle, as mentioned above. The resistors Ra and Rb are voltage detection resistors in the battery 1 and constitute a resistor voltage divider. The resistor voltage divider divides the high voltage of the battery 1 to lower the voltage to a voltage level that the downstream circuit can handle and then outputs the result. The voltage that is output (the voltage at point B in FIG. 1) is converted to a digital signal by a downstream circuit (for example, an A/D converter) and the charging state of the battery 1 may be determined based on the digital signal. The switch SW1 is a switch for controlling connection between the battery 1 and the resistor voltage divider that is configured by the resistors Ra and Rb. The switch SW1 is, for example, off when preventing the flow of dark current.

Among these constituent elements on the high-voltage side, the switch SW1 and the resistors Ra and Rb are used as a portion of the ground fault detection apparatus 10. In other words, in addition to the below-described low-voltage side constituent elements, the ground fault detection apparatus 10 also includes these constituent elements on the high-voltage side. As described below, the resistor voltage divider configured by the resistors Ra and Rb corresponds to a voltage measurement unit that measures voltage of a coupling capacitor 15 after charging. Turning of the switch SW1 on and off is controlled by a CPU 13. On the high-voltage side, the polarity of the battery 1 may be reversed (the switch SW1 may be connected to the low-potential side).

In addition to the aforementioned constituent elements on the high-voltage side, the ground fault detection apparatus 10 includes an output interface 11, a CPU 13, a coupling capacitor 15, a filter 17, and a resistor R1 as constituent elements on the low-voltage side. The ground fault detection apparatus 10 also includes switches SW2 and SW3 that switch the connection to the high-voltage side. As described below, by appropriately controlling the switches SW2 and SW3, and the switch SW1 on the high-voltage side, the ground fault detection apparatus 10 can not only detect a ground fault with a high degree of accuracy but also keeps the aluminum electrolytic capacitors of the coupling capacitor 15 from being left without any load for an extended period of time. On the low-voltage side, a power supply voltage that is quite low as compared to the battery 1 (for example, 3.3 V) is used.

The output interface 11 outputs a square-wave pulse signal in response to an instruction from the CPU 13. The square-wave pulse signal passes through the resistor R1 and reaches one terminal of the coupling capacitor 15 (measurement point A).

The CPU 13 sets the frequency and duty cycle of the square-wave pulse signal output from the output interface 11 and also detects a ground fault of the battery 1 based on the voltage signal at measurement point A acquired via the filter 17.

The filter 17 is a filter that shapes the waveform of the voltage signal at measurement point A. In this embodiment, the filter 17 is a low pass filter. The filter 17 may, for example, be configured to include a feedback circuit, such as an operational amplifier.

The coupling capacitor 15 is configured by a plurality of connected aluminum electrolytic capacitors. In this embodiment, aluminum electrolytic capacitors C1, C2, and C3 are connected in series. One terminal of the coupling capacitor 15 (the terminal of the aluminum electrolytic capacitor C3 on the opposite side from the aluminum electrolytic capacitor C2) is connected to the negative terminal of the battery 1. The other terminal of the coupling capacitor 15 (the terminal of the aluminum electrolytic capacitor C1 on the opposite side from the aluminum electrolytic capacitor C2) is connected to the measurement point A via the switch SW3.

One terminal of the switch SW2 is connected to the measurement point A via the switch SW3, and the other terminal is connected to the positive terminal of the battery 1 via the switch SW1.

The CPU 13 controls turning of the switches SW1, SW2, and SW3 on and off. The CPU 13 corresponds to the charger and discharger. The CPU 13 charges and discharges the coupling capacitor 15 when not performing the processing to detect a ground fault of the battery 1, which is a DC power supply. The CPU 13 acquires data on the state of the vehicle, including whether the ignition is on or off.

Ground Fault Detection

The following first describes detection of a ground fault by the ground fault detection apparatus 10 and then describes control of charging and discharging of the coupling capacitor 15.

As illustrated in FIG. 1, at the time of ground fault detection, the CPU 13 turns the switch SW1 and the switch SW3 on and turns the switch SW2 off. As mentioned above, the CPU 13 sets the frequency and the duty cycle of the square-wave pulse signal output by the output interface 11. In the following example, the frequency is T, and the duty cycle is 50%.

The output interface 11 generates a square-wave pulse signal based on an instruction from the CPU 13. The CPU 13 for example includes a counter and causes the output interface 11 to generate a square-wave pulse signal in accordance with time measured by the counter. In this example, the CPU 13 first causes the output interface 11 to output a signal at the "H" level of a square-wave pulse signal that will have the cycle T and the duty ratio set in advance. Immediately before the time measured by the counter reaches one half of the cycle T, i.e. immediately before the time T/2 has elapsed, the CPU 13 acquires the voltage at measurement point A. The voltage at this time is VH. The CPU 13 may, for example, detect the voltage at measurement point A with an internal voltage sensor or the like. Also, an A/D converter or the like may, for example, be provided at the output stage of the filter 17, and a digital signal indicating the voltage at the measurement point A may be acquired.

Next, the CPU 13 causes the output interface 11 to output a signal at the "L" level of the square-wave pulse signal. Immediately before the time measured by the counter reaches the cycle T, the CPU 13 acquires the voltage at measurement point A. The voltage at this time is VL.

Subsequently, the CPU 13 calculates the difference between the acquired voltage VH and the acquired voltage VL (VH−VL). This voltage difference is referred to as Vp−p.

The CPU 13 compares the voltage difference Vp−p with a first threshold V1 and determines that there is no abnormality (i.e. no ground fault) when the voltage difference Vp−p is larger than the first threshold V1. The first threshold V1 and the below-described second threshold V2 are established based on the change in voltage difference that occurs when the insulation resistance of the battery 1 reduces. The change in voltage difference can, for example, be learned by simulation, experiment, or the like.

When the voltage difference Vp−p is equal to or less than the first threshold V1, the CPU 13 compares a second threshold V2 (where V2<V1) with the voltage difference Vp−p. When V2 is smaller, the CPU 13 determines that either a minor ground fault has occurred or the vehicle body capacitance has increased. At this time, the CPU 13 may warn the user of the vehicle, for example by sound, display, or the like.

When the voltage difference Vp−p is equal to or less than the second threshold V2, the CPU 13 determines that either a major ground fault has occurred or the vehicle body capacitance has increased. At this time, the CPU 13 determines that further operation of the vehicle is not advisable and may, for example, display an indication to stop the vehicle's motor.

FIG. 2A is a timing flowchart illustrating an example of a square-wave pulse signal output by the output interface 11. FIGS. 2B, and 2C are timing flowcharts illustrating examples of voltage signals at measurement point A. S1, S2, . . . in the figures indicate the timing of sampling by the CPU 13 to acquire the voltage at the measurement point A. The sampling timings S1, S2, . . . are set slightly before the trailing edge (the falling point) and slightly before the leading edge (the rising point) of the square-wave pulse signal. In other words, the sampling timings S1, S2, . . . are set at intervals of T/2, with time points at the "H" level and the "L" level of the square-wave pulse signal being sampled alternately. At timings S1, S3, . . . (odd timings), the CPU 13 acquires the voltage VH, and at timings S2, S4, . . . (even timings), the CPU 13 acquires the voltage VL.

FIG. 2B illustrates an example of the voltage waveform generated at measurement point A in a normal state, i.e. when no ground fault has occurred. As illustrated in FIG. 2B, the voltage waveform at measurement point A slightly exhibits a smooth curve at the leading edge and trailing edge of the square-wave pulse, but for example the voltage difference Vp−p between the voltage VH measured at timing S1 and the voltage VL measured at timing S2 (i.e. VH−VL) is sufficiently large.

FIG. 2C illustrates an example of the voltage waveform generated at measurement point A when a ground fault has occurred. When a ground fault has occurred, the insulation resistance of the battery 1 is reduced. Therefore, the voltage VH measured at timings S1, S3, . . . (odd timings) is a low value. Accordingly, the voltage difference Vp−p (i.e. VH−VL) is a low value. As described above, when the voltage difference Vp−p is equal to or less than the first threshold V1 and greater than the second threshold V2, the CPU 13 may warn the user that there is a chance of a ground fault, and when the voltage difference Vp−p is less than the second threshold V2, the CPU 13 may display an indication to stop the vehicle.

When the vehicle capacitance increases, a large change occurs near the leading edge of the voltage waveform at the measurement point A, whereas there is little change near the trailing edge. Accordingly, by setting the sampling timings S1, S2, . . . to be near the trailing edge of the pulse waveform, the effect of the vehicle capacitance can be reduced. In this way, the ground fault detection apparatus 10 of this embodiment can detect a ground fault to a high degree of accuracy.

Charging and Discharging of Coupling Capacitor

As mentioned above, the coupling capacitor 15 includes the aluminum electrolytic capacitors C1, C2, and C3. When there is no ground fault in the battery 1, the high-voltage side and the low-voltage side are separated, and both terminals of the coupling capacitor 15 are in a no-load state.

In general, if an aluminum electrolytic capacitor is left without any load for an extended period of time, the leakage current may increase. An increase in the leakage current is caused by an oxide film on the anode foil reacting with the electrolyte, causing the withstand voltage to fall. Therefore, by avoiding a situation in which the aluminum electrolytic capacitors C1, C2, and C3 are left without any load for an extended period of time, the insulation level of the aluminum electrolytic capacitors C1, C2, and C3 can be maintained high, improving the long-term reliability.

Instead of the aluminum electrolytic capacitors C1, C2, and C3, the insulation level could also be maintained by, for example, using a ceramic capacitor or the like. It is difficult, however, to increase the capacitance of an individual ceramic capacitor to be equivalent to that of an aluminum electrolytic capacitor. Therefore, many ceramic capacitors would need to be used, which is impractical due to the increase in circuit scale.

As described below, the CPU 13 of the ground fault detection apparatus 10 can charge and discharge the aluminum electrolytic capacitors C1, C2, and C3 by appropriately controlling the switches SW1, SW2, and SW3 to be on or off. Upon application of voltage, the electrolyte of the aluminum electrolytic capacitors C1, C2, and C3 returns to its original state through a repair activity. For this reason, an increase in the leakage current of the aluminum electrolytic capacitors C1, C2, and C3 can be avoided.

Figure 3:
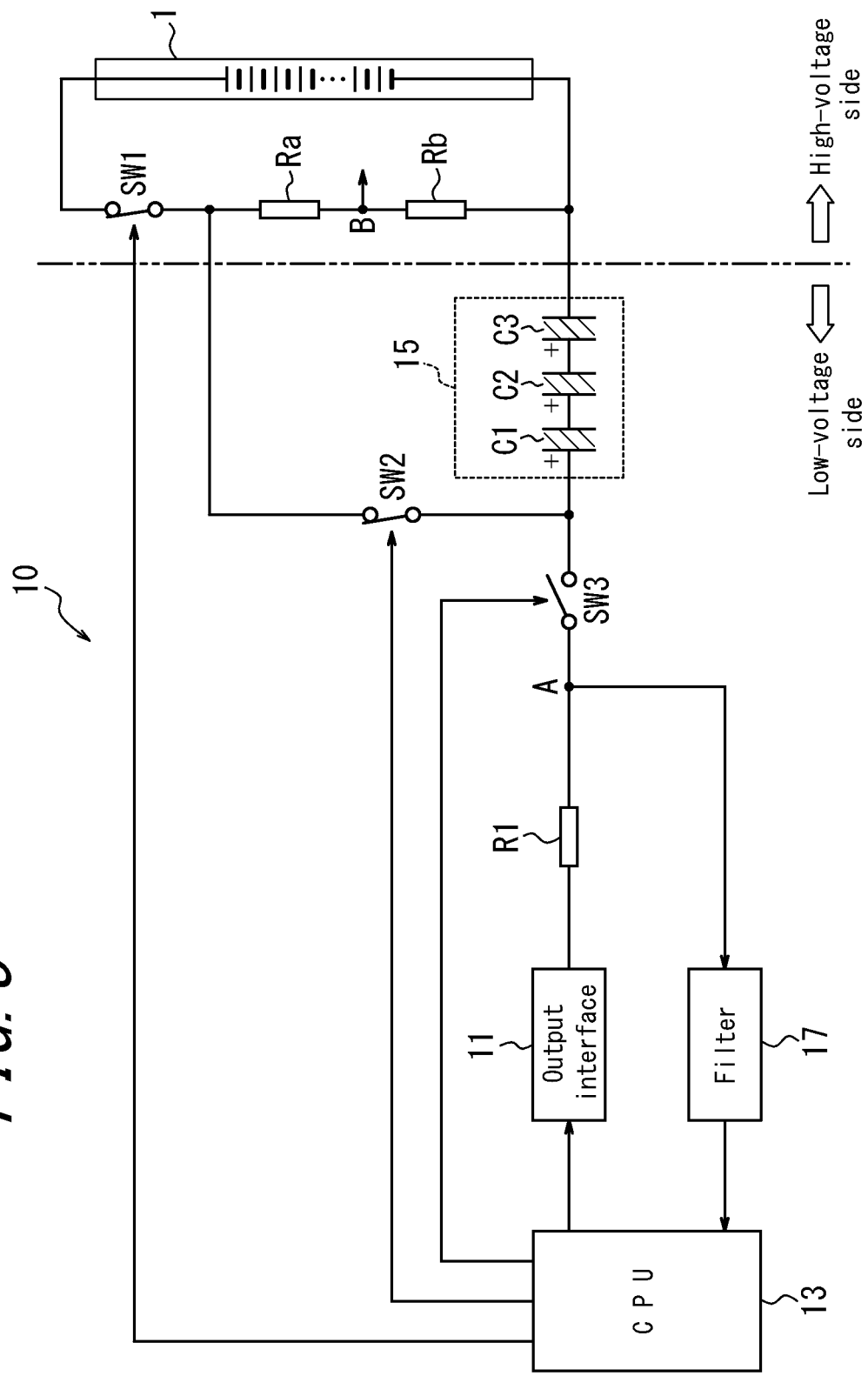
FIG. 3 illustrates a vehicle ground fault detection apparatus according to a disclosed embodiment at the time of capacitor charging.

FIG. 3 illustrates the ground fault detection apparatus 10 at the time of charging the coupling capacitor 15. Elements that are the same as in FIG. 1 are labeled with the same reference signs, and a description thereof is omitted. As illustrated in FIG. 3, at the time of charging the coupling capacitor 15, the CPU 13 turns the switch SW1 and the switch SW2 on and turns the switch SW3 off. As mentioned above, one terminal of the coupling capacitor 15 is connected to the negative terminal of the battery 1. The other terminal of the coupling capacitor 15 is connected to the positive terminal of the battery 1 by the switch SW1 and the switch SW2 being on. At this time, by the switch SW3 being off, the low-voltage side and the high-voltage side are separated, and the aluminum electrolytic capacitors C1, C2, and C3 are charged by the battery 1 for vehicle driving.

Figure 4:
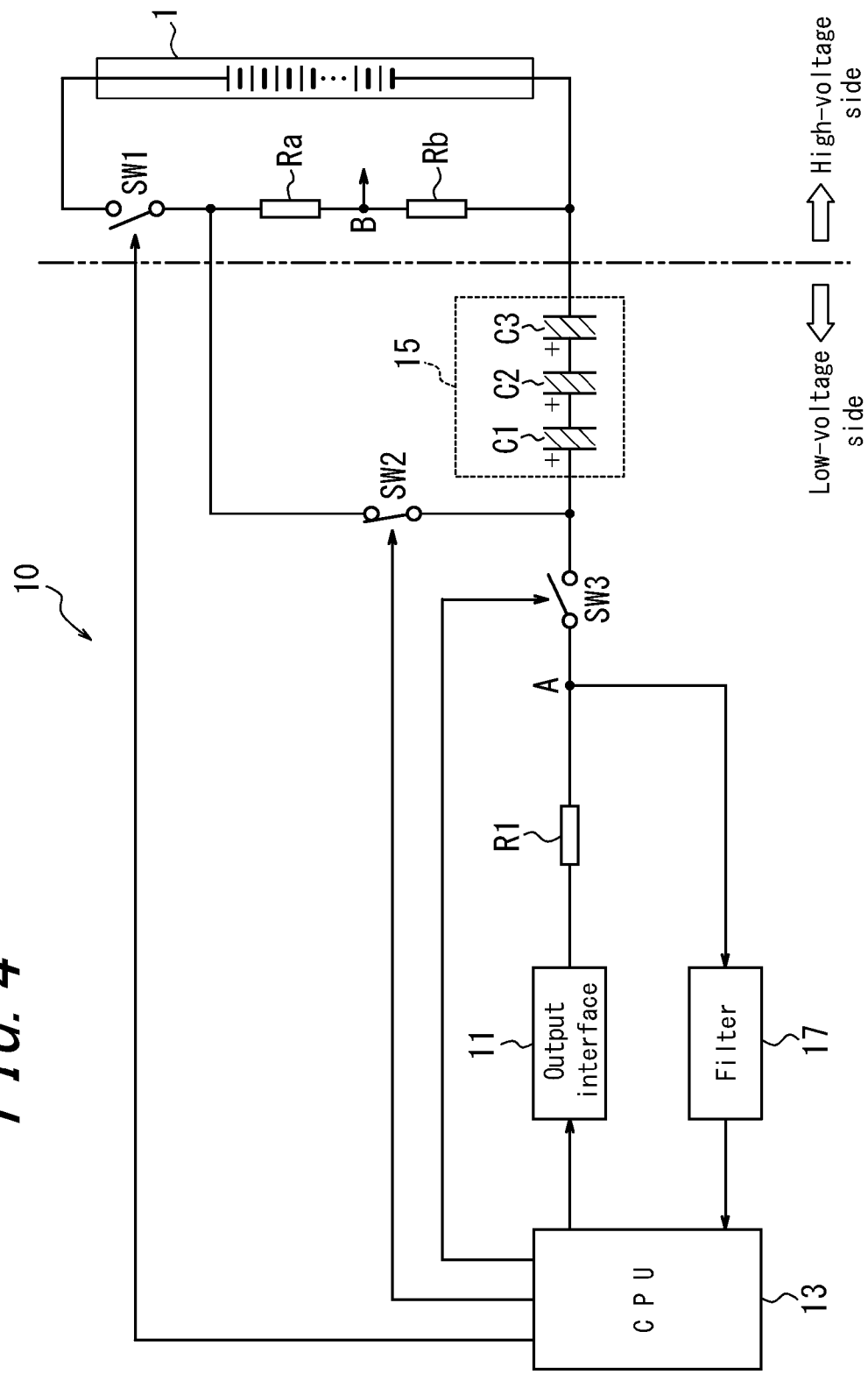
FIG. 4 illustrates a vehicle ground fault detection apparatus according to a disclosed embodiment at the time of capacitor discharging.

FIG. 4 illustrates the ground fault detection apparatus 10 at the time of discharging the coupling capacitor 15. Elements that are the same as in FIG. 1 are labeled with the same reference signs, and a description thereof is omitted. As illustrated in FIG. 4, at the time of discharging the coupling capacitor 15, the CPU 13 turns the switch SW2 on and turns the switch SW1 and the switch SW3 off. At this time, by the switch SW1 being off and the switch SW2 being on, the two terminals of the coupling capacitor 15 are connected via the resistors Ra and Rb. By the switch SW3 being off, the low-voltage side and the high-voltage side are separated, and the aluminum electrolytic capacitors C1, C2, and C3 discharge. Upon the switch SW3 turning on while the aluminum electrolytic capacitors C1, C2, and C3 are in a charged state, a large current flows into the low-voltage side and might adversely affect the ground fault detection apparatus 10. Therefore, the CPU 13 turns the switch SW3 on after discharging the coupling capacitor 15.

By the CPU 13 appropriately switching the switches SW1, SW2, and SW3 on and off, the ground fault detection apparatus 10 can detect a ground fault of the battery 1 and can also charge and discharge the coupling capacitor 15. In general, when the vehicle's ignition is on (when the vehicle is running), it is necessary to continue detecting a ground fault of the battery 1. Therefore, by executing control according to the flowchart in FIG. 5, the ground fault detection apparatus 10 can perform ground fault detection while charging and discharging the coupling capacitor 15 in between, thereby improving the long-term reliability of the aluminum electrolytic capacitors C1, C2, and C3.

Processing by Ground Fault Detection Apparatus

Figure 5:
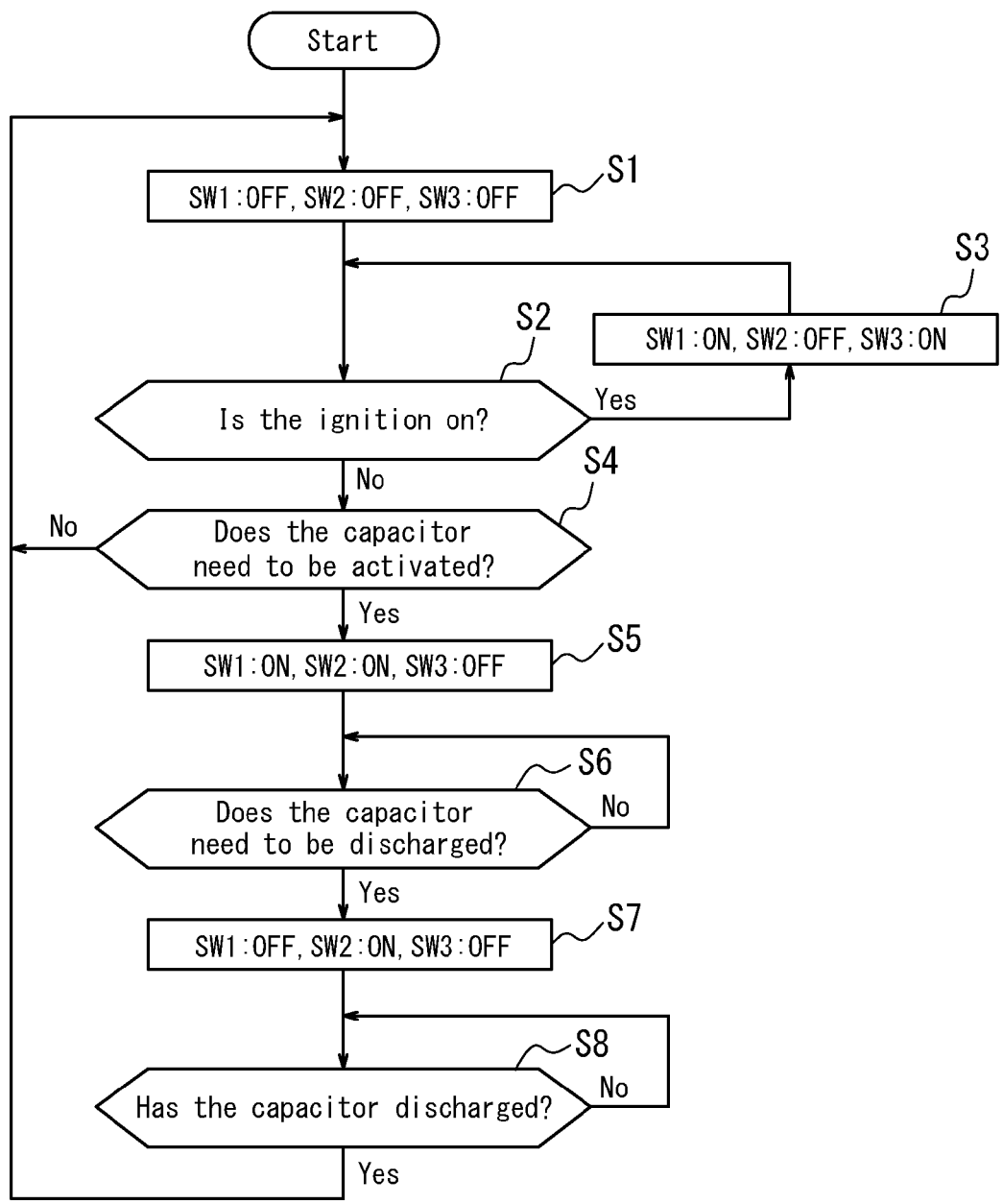
FIG. 5 is a flowchart illustrating processing by a vehicle ground fault detection apparatus according to a disclosed embodiment.

FIG. 5 is a flowchart illustrating processing by the ground fault detection apparatus 10 according to this embodiment. First, in an initial state, or when the vehicle's ignition is not on (step S2: No) and when the capacitor does not need to be activated (step S4: No), the ground fault detection apparatus 10 turns all of the switches SW1, SW2, and SW3 off (step S1). Activation of the capacitor refers to charging and discharging the coupling capacitor 15. In this example, the capacitor needs to be activated when operation of the vehicle ends and the ignition is turned from on to off. By turning all of the switches SW1, SW2, and SW3 off, the ground fault detection apparatus 10 can prevent the charging rate of the battery 1 from reducing due to dark current or the like when the vehicle is not operating.

After step S1, the ground fault detection apparatus 10 determines whether the vehicle's ignition is on (step S2). If the vehicle's ignition is on (step S2: Yes), then the ground fault detection apparatus 10 turns the switches SW1 and SW3 on and turns the switch SW2 off so as to continue detecting a ground fault during operation of the vehicle (step S3). At this time, the ground fault detection apparatus 10 enters the state illustrated in FIG. 1 and can detect a ground fault by comparing the voltage difference Vp–p with the first threshold V1 and the second threshold V2. Upon executing step S3, the ground fault detection apparatus 10 returns to step S2.

If the vehicle's ignition is not on (step S2: No), the ground fault detection apparatus 10 determines whether the capacitor needs to be activated (step S4). In this embodiment, when a vehicle that was operating stops, the ground fault detection apparatus 10 charges and discharges the coupling capacitor 15, avoiding a situation in which the coupling capacitor 15 is left without any load for an extended period of time. In other words, as mentioned above, the ground fault detection apparatus 10 determines that the capacitor needs to be activated by detecting that the ignition has turned from on to off.

Upon determining that the capacitor needs to be activated (step S4: Yes), the ground fault detection apparatus 10 charges and discharges the coupling capacitor 15 in the following way. First, the ground fault detection apparatus 10 turns the switches SW1 and SW2 on and turns the switch SW3 off (step S5). At this time, the ground fault detection apparatus 10 enters the state illustrated in FIG. 3 and charges the aluminum electrolytic capacitors C1, C2, and C3 with the battery 1 for vehicle driving.

Next, the ground fault detection apparatus 10 determines whether discharging of the capacitor is necessary (step S6). Until determining that discharging of the capacitor is necessary (while step S6: No), the ground fault detection apparatus 10 continues to charge the aluminum electrolytic capacitors C1, C2, and C3. When sufficient voltage has been applied for the electrolyte of the aluminum electrolytic capacitors C1, C2, and C3 to return to its original state through a repair activity, the ground fault detection apparatus 10 determines that charging of the capacitor is sufficient and that discharging is necessary. At this time, the ground fault detection apparatus 10 may determine that discharging of the capacitor is necessary for example based on the charging time of the capacitor, the voltage between terminals of the coupling capacitor 15, or the like.

Upon determining that the capacitor needs to be discharged (step S6: Yes), the ground fault detection apparatus 10 turns the switch SW2 on and turns the switches SW1 and SW3 off (step S7). At this time, the ground fault detection apparatus 10 enters the state illustrated in FIG. 4, the two terminals of the coupling capacitor 15 are connected via the resistors Ra and Rb, and discharge begins. The resistors Ra and Rb at this time are used as discharge resistors.

Next, the ground fault detection apparatus 10 determines whether the capacitor has been sufficiently discharged (step S8). Until discharging of the coupling capacitor 15 ends, the ground fault detection apparatus 10 continues the discharging (step S8: No). When discharging of the coupling capacitor 15 ends (step S8: Yes), a large current does not flow from the coupling capacitor 15 to the low-voltage side. Therefore, the switch SW3 can be turned on. Subsequently, processing by the ground fault detection apparatus 10 returns to step S1.

Figure 6:
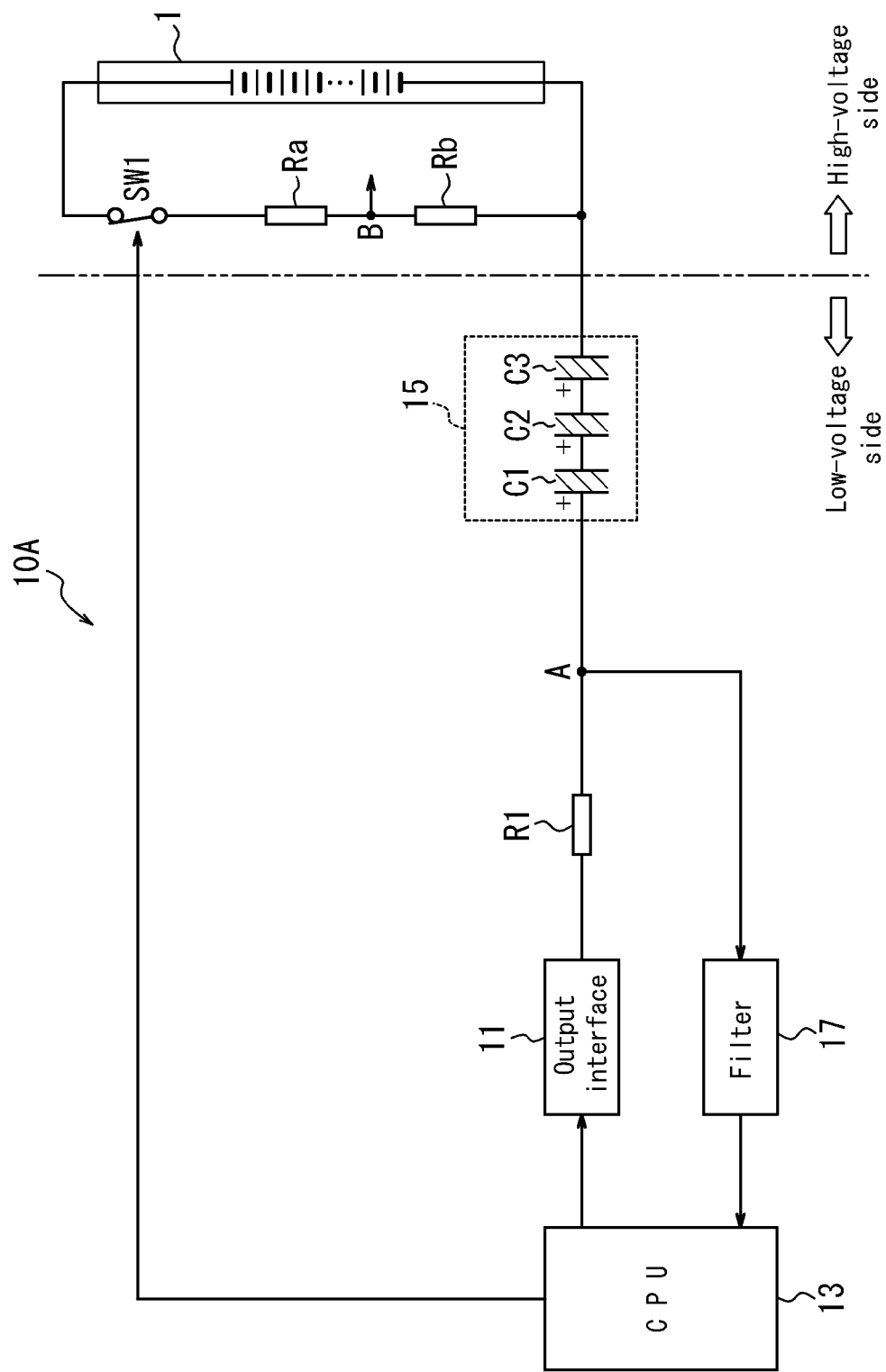
FIG. 6 illustrates a conventional vehicle ground fault detection apparatus.

As described above, according to the ground fault detection apparatus 10 of this embodiment, not only can a ground fault be detected to a high degree of accuracy, but also the aluminum electrolytic capacitors C1, C2, and C3 of the coupling capacitor 15 can be keep from being left without any load for an extended period of time. FIG. 6 illustrates a conventional vehicle ground fault detection apparatus 10A. The ground fault detection apparatus 10 according to this embodiment differs from the conventional ground fault detection apparatus 10A by including the switches SW2 and SW3.

In the circuit configuration of the conventional ground fault detection apparatus 10A illustrated in FIG. 6, a ground fault of the battery 1 can be detected to a high degree of accuracy. The conventional ground fault detection apparatus 10A does not, however, include the switches SW2 and SW3. Therefore, the conventional ground fault detection apparatus 10A cannot adopt the circuit configuration of the ground fault detection apparatus 10 (FIG. 3, FIG. 4) that efficiently charges and discharges the aluminum electrolytic capacitors C1, C2, and C3 of the coupling capacitor 15.

By contrast, with nearly no increase in the circuit scale, the ground fault detection apparatus 10 of this embodiment can not only detect a ground fault to a high degree of accuracy but can also charge and discharge the coupling capacitor 15 when not detecting a ground fault. Therefore, even when the coupling capacitor 15 is configured by aluminum electrolytic capacitors, the aluminum electrolytic capacitors can be charged and discharged before an increase in leakage current, thus maintaining a high level of insulation in the aluminum electrolytic capacitors to improve long-term reliability.

The ground fault detection apparatus 10 of this embodiment includes the resistor voltage divider, used in the conventional example, that is configured by resistors Ra and Rb. This resistor voltage divider is used to measure the voltage of the battery 1 when detecting a ground fault. In the ground fault detection apparatus 10 of this embodiment, for example as illustrated in FIG. 4, the same resistor voltage divider may also be used as a voltage measurement unit that measures the voltage of the coupling capacitor 15. For example by measuring the voltage after charging the coupling capacitor 15 with the voltage measurement unit, an open fault in a portion or all of the aluminum electrolytic capacitors C1, C2, and C3 can be detected. At this time, since there is no need to provide a dedicated voltage measurement unit for measuring voltage of the coupling capacitor 15, an increase in the circuit scale of the ground fault detection apparatus 10 can be suppressed.

The ground fault detection apparatus 10 of this embodiment includes the battery 1 for vehicle driving also used in the conventional example. For example as illustrated in FIG. 3, the coupling capacitor 15 charges using the battery 1 as a power supply. At this time, since there is no need to provide a dedicated battery for charging the coupling capacitor 15, an increase in the circuit scale of the ground fault detection apparatus 10 can be suppressed.

The ground fault detection apparatus 10 of this embodiment includes the resistors Ra and Rb also used in the conventional example. As mentioned above, the resistors Ra and Rb are voltage detection resistors used to measure the voltage of the battery 1. For example as illustrated in FIG. 4, the resistors Ra and Rb that are voltage detection resistors are used as discharge resistors at the time of discharging of the coupling capacitor 15.

At this time, since there is no need to provide a dedicated load in the circuit that discharges the coupling capacitor 15, an increase in the circuit scale of the ground fault detection apparatus 10 can be suppressed.

The ground fault detection apparatus 10 of this embodiment can charge and discharge the coupling capacitor 15 while the ignition is off. Ground fault detection might be carried out while the ignition is on (while the vehicle is running), but the ground fault detection apparatus 10 can maintain a high level of insulation in the aluminum electrolytic capacitors without impeding ground fault detection.

In the ground fault detection apparatus 10 of this embodiment, the coupling capacitor 15 includes a plurality of connected aluminum electrolytic capacitors. Therefore, even if some of the aluminum electrolytic capacitors short out, withstand voltage can be guaranteed with the remaining aluminum electrolytic capacitors. Hence, a failure resistant coupling capacitor 15 can be implemented.

Although this disclosure is based on embodiments and drawings, it is to be noted that various changes and modifications will be apparent to those skilled in the art based on this disclosure. Therefore, such changes and modifications are to be understood as included within the scope of this disclosure. For example, the functions and the like included in the various blocks and steps may be reordered in any logically consistent way. Furthermore, blocks or steps may be combined into one or divided.

For example, the ground fault detection apparatus 10 in the above embodiment uses the resistor voltage divider that measures the voltage of the battery 1 as the voltage measurement unit that measures the voltage of the coupling capacitor 15. The ground fault detection apparatus 10 may, however, be provided with a unique voltage measurement unit. The ground fault detection apparatus 10 in the above embodiment uses the battery 1 for vehicle driving as the power supply that charges the coupling capacitor 15. The ground fault detection apparatus 10 may, however, be provided with a unique power supply. The ground fault detection apparatus 10 in the above embodiment uses the resistors Ra and Rb, which are voltage detection resistors, as discharge resistors for the coupling capacitor 15. The ground fault detection apparatus 10 may, however, be provided with unique discharge resistors. The coupling capacitor 15 may be configured by a plurality of aluminum electrolytic capacitors connected in parallel or in a combination of a series connection and a parallel connection.

REFERENCE SIGNS LIST

1 Battery
10, 10A Ground fault detection apparatus
11 Output interface
13 CPU
15 Coupling capacitor
17 Filter
C1, C2, C3 Aluminum electrolytic capacitor
R1, Ra, Rb Resistor
SW1, SW2, SW3 Switch

The invention claimed is:

1. A vehicle ground fault detection apparatus for detecting a ground fault of a DC power supply by connecting a positive terminal or a negative terminal of a high-voltage power supply to one terminal of a coupling capacitor provided with an aluminum electrolytic capacitor, applying a square-wave pulse signal to a measurement point at the other terminal of the coupling capacitor, and detecting a voltage signal generated at the measurement point, the vehicle ground fault detection apparatus comprising:
a charger and discharger configured to charge and discharge the coupling capacitor when a process of detecting a ground fault of the DC power supply is not being performed.

2. The vehicle ground fault detection apparatus of claim 1, further comprising a voltage measurement unit configured to measure a voltage of the coupling capacitor after charging.

3. The vehicle ground fault detection apparatus of claim 2, wherein the voltage measurement unit is further configured to measure a voltage of a battery for vehicle driving.

4. The vehicle ground fault detection apparatus of claim 3, wherein the battery for vehicle driving is used as a power supply to charge the coupling capacitor.

5. The vehicle ground fault detection apparatus of claim 4, wherein a voltage detection resistor is used in a circuit to discharge the coupling capacitor.

6. The vehicle ground fault detection apparatus of claim 4, wherein the coupling capacitor is charged and discharged while an ignition is off.

7. The vehicle ground fault detection apparatus of claim 3, wherein a voltage detection resistor is used in a circuit to discharge the coupling capacitor.

8. The vehicle ground fault detection apparatus of claim 3, wherein the coupling capacitor is charged and discharged while an ignition is off.

9. The vehicle ground fault detection apparatus of claim 2, wherein a battery for vehicle driving is used as a power supply to charge the coupling capacitor.

10. The vehicle ground fault detection apparatus of claim 9, wherein a voltage detection resistor is used in a circuit to discharge the coupling capacitor.

11. The vehicle ground fault detection apparatus of claim 9, wherein the coupling capacitor is charged and discharged while an ignition is off.

12. The vehicle ground fault detection apparatus of claim 2, wherein a voltage detection resistor is used in a circuit to discharge the coupling capacitor.

13. The vehicle ground fault detection apparatus of claim 2, wherein the coupling capacitor is charged and discharged while an ignition is off.

14. The vehicle ground fault detection apparatus of claim 1, wherein a battery for vehicle driving is used as a power supply to charge the coupling capacitor.

15. The vehicle ground fault detection apparatus of claim 14, wherein a voltage detection resistor is used in a circuit to discharge the coupling capacitor.

16. The vehicle ground fault detection apparatus of claim 14, wherein the coupling capacitor is charged and discharged while an ignition is off.

17. The vehicle ground fault detection apparatus of claim 1, wherein a voltage detection resistor is used in a circuit to discharge the coupling capacitor.

18. The vehicle ground fault detection apparatus of claim 17, wherein the coupling capacitor is charged and discharged while an ignition is off.

19. The vehicle ground fault detection apparatus of claim 1, wherein the coupling capacitor is charged and discharged while an ignition is off.

20. The vehicle ground fault detection apparatus of claim 1, wherein the coupling capacitor comprises a plurality of aluminum electrolytic capacitors.

* * * * *